(12) United States Patent
Kim et al.

(10) Patent No.: US 8,244,079 B2
(45) Date of Patent: Aug. 14, 2012

(54) LIGHT EMITTING DEVICE AND OPTICAL COUPLING MODULE

(75) Inventors: Jin-Tae Kim, Daejeon (KR); Sun-Tak Park, Daejeon (KR); Jung-Jin Ju, Daejeon (KR); Seung-Koo Park, Daejeon (KR); Min-Su Kim, Daejeon (KR); Jong-Moo Lee, Daejeon (KR); Joong-Seon Choe, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 407 days.

(21) Appl. No.: 12/482,502

(22) Filed: Jun. 11, 2009

(65) Prior Publication Data

US 2010/0158440 A1   Jun. 24, 2010

(30) Foreign Application Priority Data

Dec. 19, 2008   (KR) ........................ 10-2008-0130468

(51) Int. Cl.
*G02B 6/12* (2006.01)
(52) U.S. Cl. ............................................ 385/14; 385/31
(58) Field of Classification Search ................. None
See application file for complete search history.

(56) References Cited

U.S. PATENT DOCUMENTS

| 6,491,447 | B2 | 12/2002 | Aihara |
| 6,512,861 | B2 * | 1/2003 | Chakravorty et al. .......... 385/14 |
| 6,895,134 | B2 * | 5/2005 | Glogovsky et al. ............. 385/14 |
| 7,136,554 | B1 | 11/2006 | Stevens |
| 7,263,248 | B2 | 8/2007 | Windover |
| 2003/0039455 | A1 * | 2/2003 | Ouchi ............................. 385/88 |
| 2004/0033025 | A1 * | 2/2004 | Richard et al. .................. 385/49 |
| 2006/0104562 | A1 | 5/2006 | Rosch et al. |

FOREIGN PATENT DOCUMENTS

| JP | 2006-013048 A | 1/2006 |
| JP | 2007-299985 A | 11/2007 |
| KR | 10-0299121 B1 | 6/2001 |
| KR | 2007-0113791 | 11/2007 |
| KR | 0811910 | 3/2008 |

* cited by examiner

*Primary Examiner* — Tina Wong
(74) *Attorney, Agent, or Firm* — Rabin & Berdo, P.C.

(57) ABSTRACT

Provided are a light emitting device and an optical coupling module. The device includes a substrate, a light emitting part provided to the substrate, and a reflecting part provided to a lower surface of the substrate. The light emitting part includes an active pattern disposed on the substrate, an upper mirror provided to an upper portion of the active pattern, and a lower mirror provided to a lower portion of the active pattern. The light emitting part may emit light normal to the substrate, and the reflecting part may reflect the emitted light to a side surface of the substrate.

24 Claims, 15 Drawing Sheets

LIGHT EMITTING DEVICE AND OPTICAL COUPLING MODULE

CROSS-REFERENCE TO RELATED APPLICATIONS

This U.S. non-provisional patent application claims priority under 35 U.S.C. §119 of Korean Patent Application No. 10-2008-0130468, filed on Dec. 19, 2008, the entire contents of which are hereby incorporated by reference.

BACKGROUND OF THE INVENTION

The present invention disclosed herein relates to a light emitting device and an optical coupling module, and more particularly, to a light emitting device including a reflecting part in its lower portion.

Methods of processing data between semiconductor chips or boards by using optical communication technology are the subject of much interest because they address issues such as electromagnetic interference (EMI), impedance mismatch, and signal skew due to copper interconnections. Proposals have been made for photoelectric interconnection modules including optical interconnections and electrical interconnections that are used as interconnections of printed circuit boards.

Such photoelectric interconnection modules realize optical communication with high efficiency and signal integrity. Reducing optical coupling loss between electro-optical devices (light emitting devices or light receiving devices) and optical waveguides is required to decrease manufacturing costs of photoelectric interconnection modules. As the number of channels is increased, arranging electro-optical devices and optical waveguides of photoelectric interconnection modules takes a long time and causes technical limitations.

SUMMARY OF THE INVENTION

The present invention provides a light emitting device adapted for efficiently forming a photoelectric interconnection.

The present invention provides an optical coupling module adapted for efficiently forming a photoelectric interconnection.

Embodiments of the present invention provide light emitting devices including: a substrate; a light emitting part provided to the substrate; and a reflecting part provided to a lower surface of the substrate, wherein the light emitting part includes: an active pattern disposed on the substrate; an upper mirror provided to an upper portion of the active pattern; and a lower mirror provided to a lower portion of the active pattern, and the light emitting part emits light normal to the substrate, and the reflecting part reflects the emitted light to a side surface of the substrate.

In some embodiments, the reflecting part may include a trench.

In other embodiments, the trench may have an inclined surface that makes about 45 degrees with a normal direction to the substrate.

In still other embodiments, the reflecting part may further include a reflecting film provided to a surface of the trench.

In even other embodiments, the reflecting film may include dielectric or metal.

In yet other embodiments, the reflecting part may further include a reflecting body filling the trench.

In further embodiments, the reflecting body may be less than the substrate in refractivity.

In still further embodiments, the trench may have an extension direction that is tilted from an extension direction of the side surface of the substrate.

In even further embodiments, the trench may have a curved inclined surface.

In other embodiments of the present invention, optical coupling modules include: a first mounting substrate; a light emitting device provided to the first mounting substrate; and an optical waveguide in direct contact with a side surface of the light emitting device, wherein the light emitting device includes: a light emitting part provided to a first substrate; and a reflecting part provided to a lower surface of the first substrate, and the light emitting part emits light normal to the first substrate, and the reflecting part reflects the emitted light through a side surface of the first substrate to a first side of the optical waveguide.

In some embodiments, the reflecting part of the light emitting device may face the first mounting substrate.

In other embodiments, the optical waveguide may include a dielectric waveguide having a structure including a core and a cladding.

In still other embodiments, the optical waveguide may include a multimode optical fiber having a structure including a core and a cladding.

In even other embodiments, the optical waveguide may include a metal line core and a dielectric cladding surrounding the metal wire core.

In yet other embodiments, the metal line core may have a thickness ranging from about 2 nm to about 200 nm, and a width ranging from about 2 μm to about 100 μm.

In further embodiments, the optical waveguide may include: a dielectric stack structure including a core layer and a cladding layer; and an electrical interconnection disposed on the cladding layer, and the electrical interconnection may apply stress to the dielectric stack structure.

In still further embodiments, the optical waveguide may be bendable.

In even further embodiments, the first side of the optical waveguide may be disposed on the first mounting substrate.

In yet further embodiments, the optical coupling modules may further include: a light receiving device in contact with a second side of the optical waveguide; and a second mounting substrate provided with the light receiving device.

In much further embodiments, the second side of the optical waveguide may be disposed on the second mounting substrate.

In still much further embodiments, the light receiving device may include: a light receiving part disposed on a second substrate; and a second reflecting part provided to a lower surface of the second substrate, and the light receiving device may provide light, incident through a side surface of the second substrate, to the light receiving part through the second reflecting part.

In even much further embodiments, the first mounting substrate may be formed integrally with the second mounting substrate in a single body.

In yet much further embodiments, the optical coupling modules may further include a light emitting device driving part disposed on the first mounting substrate and driving the light emitting device.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
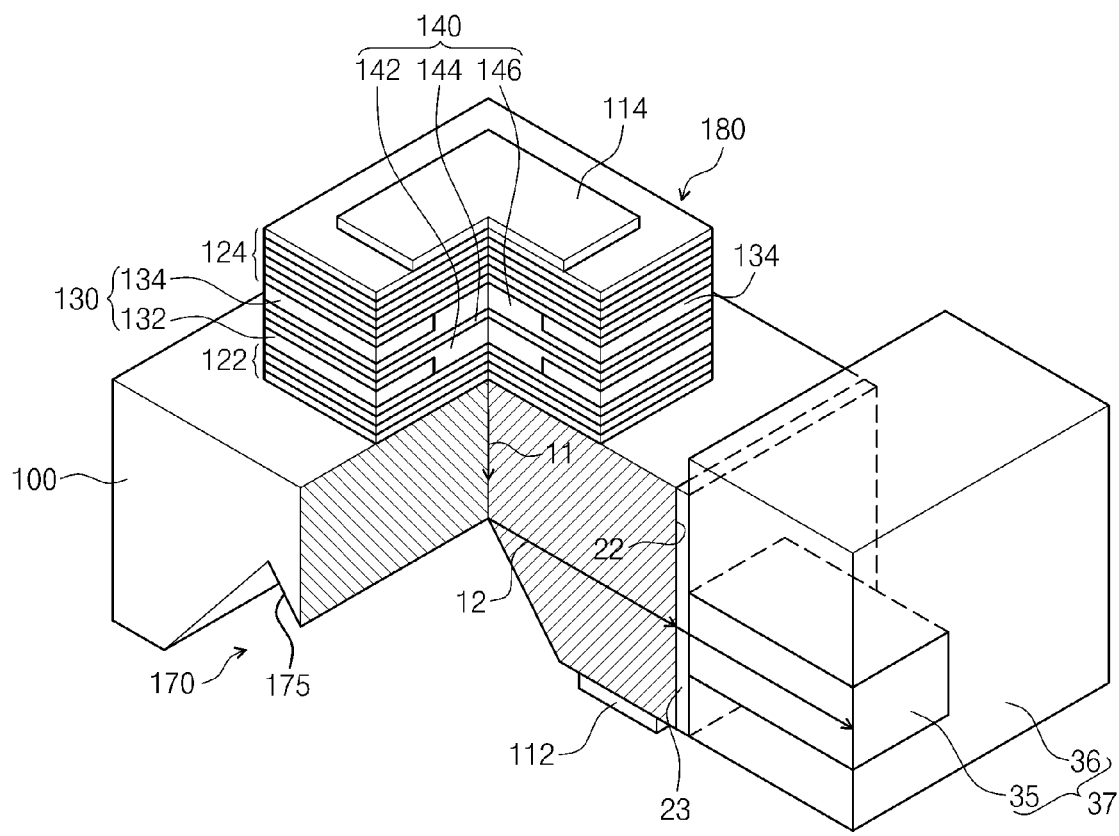
FIG. 1 is a schematic view illustrating a light emitting device according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Hereinafter, it will be described about exemplary embodiments of the present invention in conjunction with the accompanying drawings.

FIG. 1 is a schematic view illustrating a light emitting device according to an embodiment of the present invention.

Referring to FIG. 1, the light-emitting device includes a substrate 100, a light emitting part 180 provided to the substrate 100, a reflecting part 170 provided to a lower surface of the substrate 100, and a lower electrode 112 provided to a lower portion of the substrate 100. The light emitting part 180 may include an active pattern 140 disposed on the substrate 100, an upper electrode 114 disposed on the active pattern 140, an upper mirror 124 provided to an upper portion of the active pattern 140, and a lower mirror 122 provided to a lower portion of the active pattern 140. The light emitting part 180 may emit a light 11 that is normal to the substrate 100, and the reflecting part 170 may reflect the light 11 to a side surface 22 of the substrate 100.

The substrate 100 may be an n-type InP substrate or GaAs substrate. The lower mirror 122 may be disposed on the substrate 100 to satisfy the Bragg condition. A current limiting pattern 130 may be disposed on the lower mirror 122. The current limiting pattern 130 may include a first current limiting pattern 132 and a second current limiting pattern 134. The first current limiting pattern 132 and the second current limiting pattern 134 may have a ring or washer shape with a penetrated portion. The active pattern 140 may be disposed between the first current limiting pattern 132 and the second current limiting pattern 134. The active pattern 140 may extend through the penetrated portions of the first current limiting pattern 132 and the second current limiting pattern 134. The active pattern 140 may provide an optical gain of a laser beam resonating between the upper mirror 124 and the lower mirror 122. The active pattern 140 may have a multi-layered structure including an upper clad layer 146, a multi-quantum well layer 144, and a lower clad layer 142. The upper mirror 124 may be disposed on the second current limiting pattern 134 to satisfy the Bragg condition. The upper electrode 114 may be disposed on the upper mirror 124. The lower mirror 122 and the upper mirror 124 may be multi-layered thin films including InAlGaAs/InAlAs, InAlGaAs/InP, or GaAsSb/AlAsSb. The upper mirror 124 may be greater than the lower mirror 122 in reflectivity. The first current limiting pattern 132 and the second current limiting pattern 134 may be aluminum oxide layers. The substrate 100 may be a GaAs substrate or an InP substrate. The reflecting part 170 may be provided to the lower surface of the substrate 100 by etching the lower surface of the substrate 100. The reflecting part 170 may reflect the emitted light 11 to the side surface 22 of the substrate 100. The reflecting part 170 may include a trench 175 provided to the lower surface of the substrate 100. The trench 175 may include an inclined surface that may be aligned with the light-emitting part 180. Accordingly, the emitted light 11, traveling to the lower surface of the substrate 100, is incident obliquely to the inclined surface of the trench 175 and reflected to provide a reflected light 12. The inclined surface of the trench 175 may make an angle of about 45 degrees with a normal line to the substrate 100. The reflected light 12 may be incident normally to the side surface 22 of the substrate 100. The side surface 22 of the substrate 100 may be provided with an anti-reflection film 23.

An optical waveguide 37 may be provided to the side surface 22 of the substrate 100. The optical waveguide 37 may be in contact with the side surface 22 of the substrate 100. The side surface 22 of the substrate 100 may be coated with the anti-reflection film 23. The optical waveguide 37 may include a cladding 36 and a core 35. The reflected light 12 may be coupled to the core 35.

According to another embodiment of the present invention, the structure of the active pattern, the structure and arrangement of the lower mirror and the upper mirror, and the structure and arrangement of the lower electrode and the upper electrode can be varied.

According to another embodiment of the present invention, the lower electrode may be disposed between the substrate and the lower mirror.

Figure 2A:
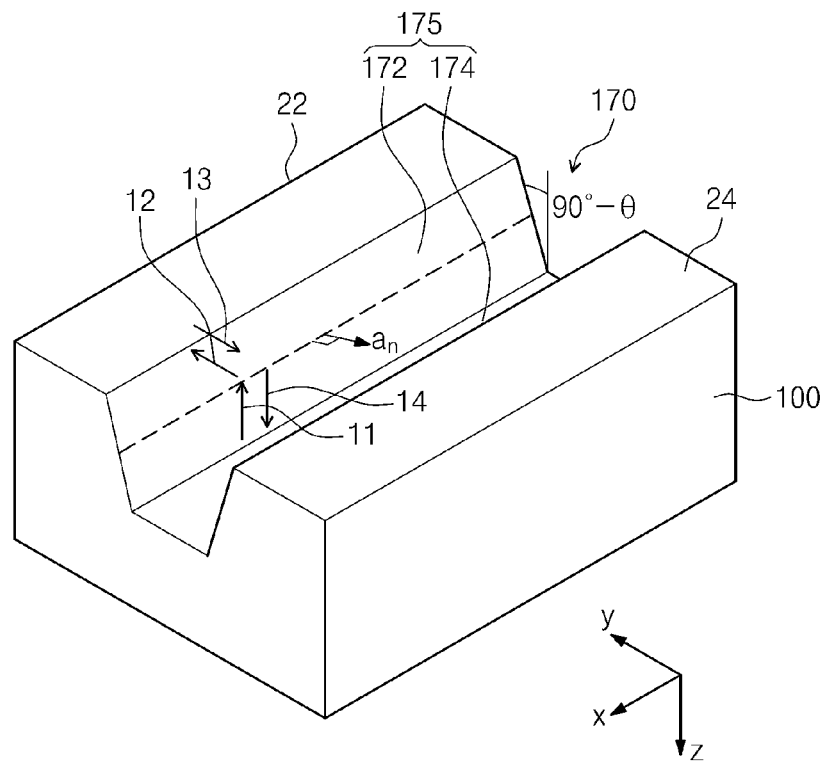
FIGS. 2A and 2B are schematic views illustrating a light emitting device according to another embodiment of the present invention.
Figure 2B:
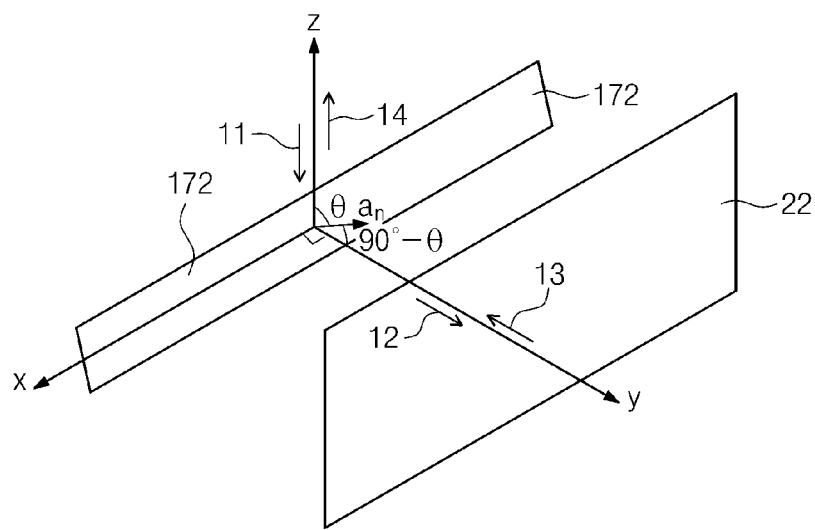

FIGS. 2A and 2B are schematic views illustrating the reflecting part 170 of a light emitting device according to an embodiment of the present invention.

Referring to FIGS. 2A and 2B, the emitted light 11 from the light emitting part 180 may be incident normally to the substrate 100. The reflecting part 170 may reflect the emitted light 11 to the side surface 22 of the substrate 100. The reflecting part 170 may include the trench 175 provided to a lower surface 24 of the substrate 100. The trench 175 may include a bottom surface 174 and an inclined surface 172. The inclined surface 172 of the trench 175 may be aligned with the light-emitting part 180 of FIG. 1. Accordingly, the emitted light 11 may be incident obliquely to the inclined surface 172 and reflected to provide the reflected light 12. An angle (90°−θ), made by the inclined surface 172 of the trench 175 with a normal line to the substrate 100, may be about 45 degrees. According to another embodiment of the present invention, the emitted light 11, incident to the inclined surface 172 of the trench 175, may be totally reflected.

The substrate 100 may be a hexahedron. The faces of the hexahedron may be disposed along the axes of the Cartesian coordinate system, respectively. The z axis of the Cartesian coordinate system may be normal to a planar surface of the substrate 100. A normal vector $a_n$ to the inclined surface 172 of the trench 175 may make a predetermined angle θ with the z axis. The x-axis may coincide with the extension direction of the trench 175. The y axis may be normal to the side surface 22 of the substrate 100. The emitted light 11 from the light-emitting part 180 may travel in the negative z-axis direction. The emitted light 11 may be incident obliquely to the inclined surface 172 of the trench 175. The emitted light 11 may be reflected from the inclined surface 172 of the trench 175 to provide the reflected light 12 traveling in the y-axis direction. The reflected light 22 may be partially reflected and partially transmitted through the side surface 22 of the substrate 100. The portion of the reflected light 12 reflected from the side surface 22 of the substrate 100 may provide a second reflected light 13. The second reflected light 13 may be re-incident to the inclined surface 172 of the trench 175 to provide a third reflected light 14. The third reflected light 14 may be incident to the light-emitting part 180, thereby making the operation of the light-emitting part 180 unstable.

According to another embodiment of the present invention, the side surface 22 of the substrate 100 may be coated with an anti-reflection film. This minimizes the amount of the second reflected light 13 reflected from the side surface 22 of the substrate 100.

Figure 3A:
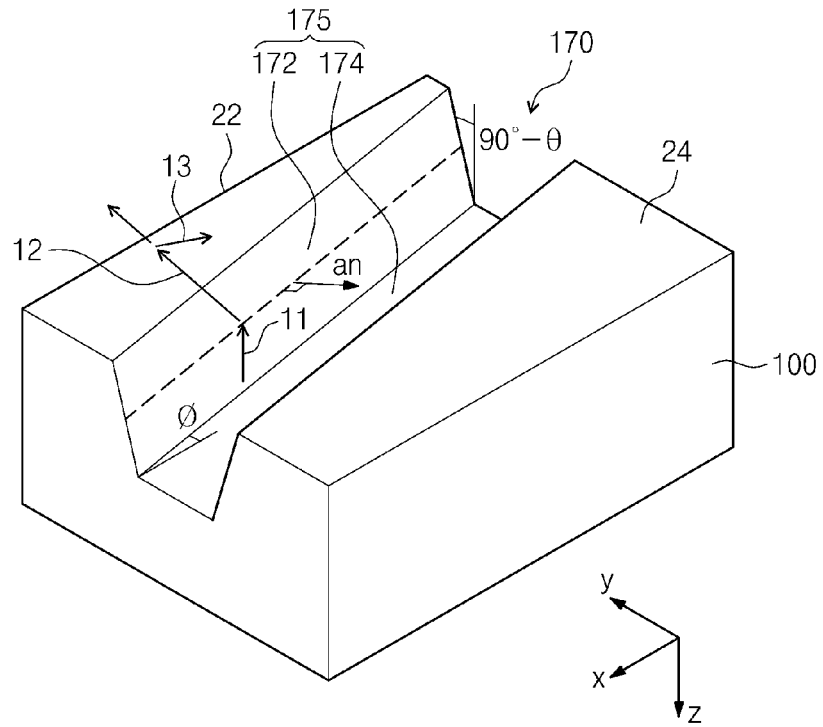
FIGS. 3A and 3B are schematic views illustrating a light emitting device according to another embodiment of the present invention.
Figure 3B:
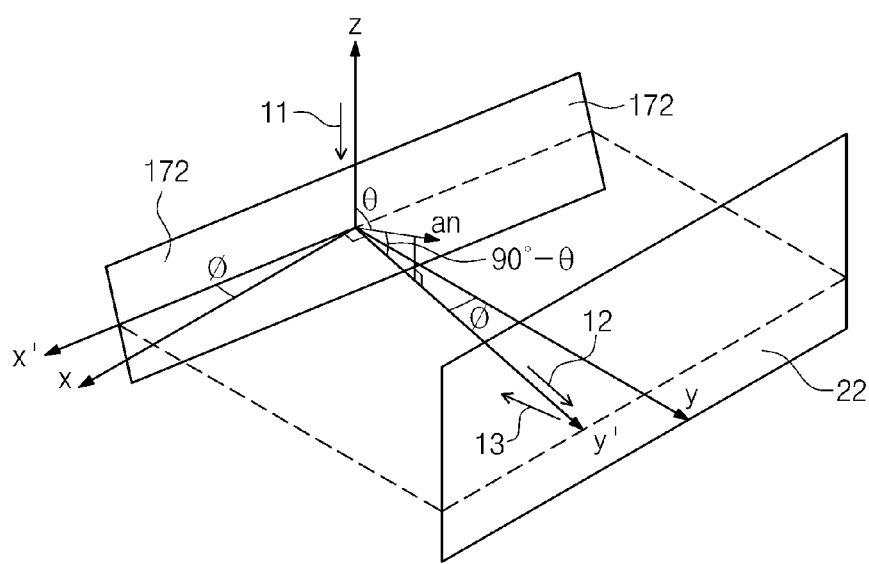

FIGS. 3A and 3B are schematic views illustrating the reflecting part 170 of a light emitting device according to another embodiment of the present invention. The same part as that described with FIGS. 2A and 2B will be omitted.

Referring to FIGS. 3A and 3B, the emitted light 11 from the light-emitting part 180 FIG. 1 may be incident normally to the substrate 100. The reflecting part 170 may reflect the emitted light 11 to the side surface 22 of the substrate 100. The reflecting part 170 may include the trench 175 provided to the lower surface 24 of the substrate 100. The trench 175 may include the bottom surface 174 and the inclined surface 172. The inclined surface 172 of the trench 175 may be aligned with the light-emitting part 180. Accordingly, the emitted light 11 may be incident obliquely to the inclined surface 172 and reflected to provide the reflected light 12. An angle (90°−θ), made by the inclined surface 172 of the trench 175 with a normal line to the substrate 100, may be about 45 degrees.

The substrate 100 may be a hexahedron. The faces of the hexahedron may be disposed along the axes of the Cartesian coordinate system, respectively. The z-axis of the Cartesian coordinate system may be normal to a planar surface of the substrate 100. A normal vector $a_n$ to the inclined surface 172 of the trench 175 may make a predetermined angle θ with the z-axis. The x-axis may make a predetermined angle Ø with the extension direction of the trench 175. That is, the inclined surface 172 may be tilted through the angle Ø about the z-axis. The extension direction of the trench 175 may be the x'-axis of a coordinate system that is rotated through a predetermined angle about the z-axis. The x'-axis of the rotated coordinate system may make the angle Ø with the x-axis. The y-axis may be normal to the side surface 22 of the substrate 100. The emitted light 11 from the light-emitting part 180 may travel in the negative z-axis direction. The emitted light 11 may be incident obliquely to the inclined surface 172 of the trench 175. The emitted light 11 may be reflected from the inclined surface 172 of the trench 175 to provide the first reflected light 12 traveling in the y'-axis direction. The first reflected light 12 may be incident obliquely to the side surface 22 of the substrate 100. The first reflected light 12 may be partially reflected from the side surface 22 to provide the second reflected light 13, and may be partially transmitted through the side surface 22. The path of the second reflected light 13 may be different from that of the first reflected light 12. Thus, the second reflected light 13 may not return to the light-emitting part 180, which improves the operation characteristics of the light-emitting part 180.

FIGS. 4 through 8 are schematic views illustrating the reflecting parts 170 of light emitting devices according to other embodiments of the present invention. The same part as described with FIGS. 2A and 2B will be omitted.

Figure 4:
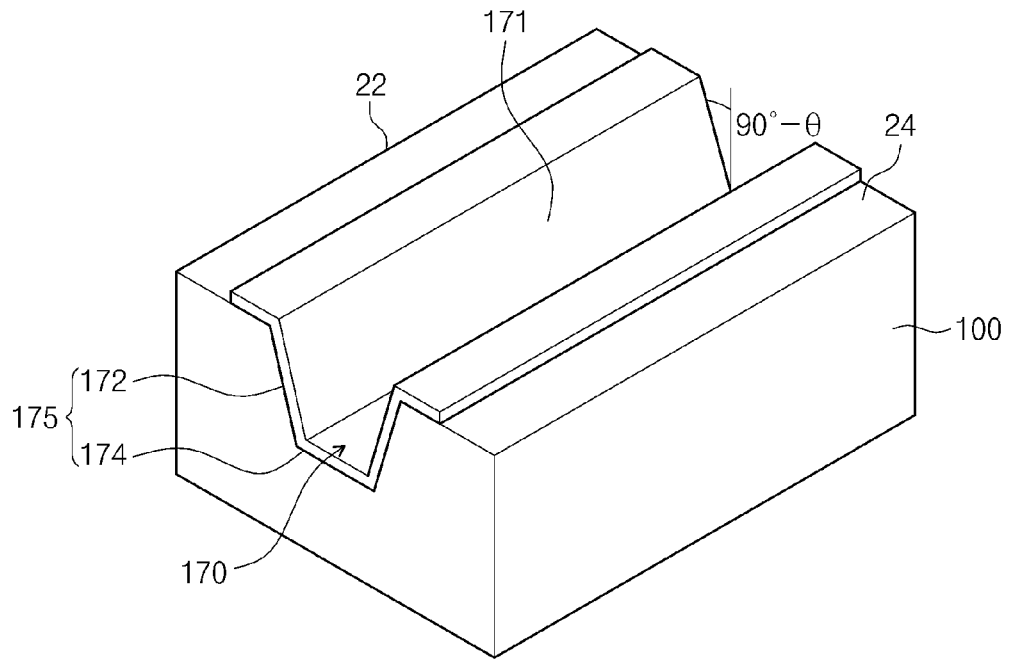
FIGS. 4 through 8 are schematic views illustrating reflecting parts according to embodiments of the present invention.

Referring to FIG. 4, the light emitting device includes the substrate 100, a light-emitting part (not shown) provided to the substrate 100, and the reflecting part 170 provided to the lower surface 24 of the substrate 100. The light-emitting part emits light, normal to the substrate 100, to the lower surface 24 of the substrate 100. The reflecting part 170 may reflect the emitted light to the side surface 22 of the substrate 100. The reflecting part 170 may include the trench 175 provided to the lower surface 24 of the substrate 100. The trench 175 may include the bottom surface 174 and the inclined surface 172. A reflecting film 171 may be disposed on the inclined surface 172 of the trench 175. The reflecting film 171 may be a metal thin film or a dielectric multi-layered thin film. The reflecting film 171 is adapted to minimize the loss of the emitted light and reflect the emitted light to the side surface 22 of the substrate 100. The reflecting film 171 may extend to the bottom surface 174 and/or the lower surface 24 of the substrate 100.

Figure 5:
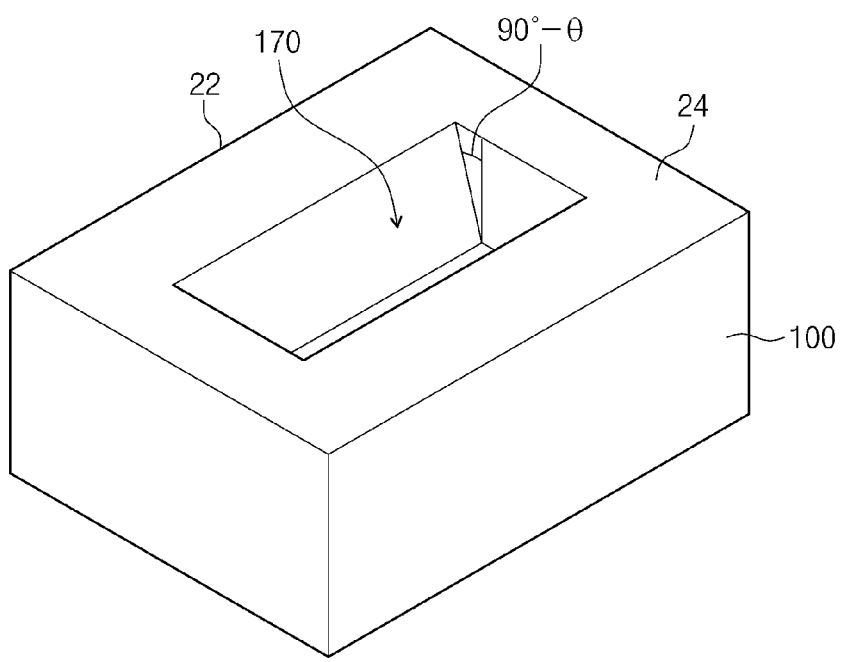

Referring to FIG. 5, the light emitting device includes the substrate 100, a light-emitting part (not shown) provided to the substrate 100, and the reflecting part 170 provided to the lower surface 24 of the substrate 100. The reflecting part 170 may have an inclined indentation. The cross-section of the inclined indentation may be tetragonal, polygonal, or oval. An inclined surface of the indentation may be aligned with the light-emitting part.

Figure 6:
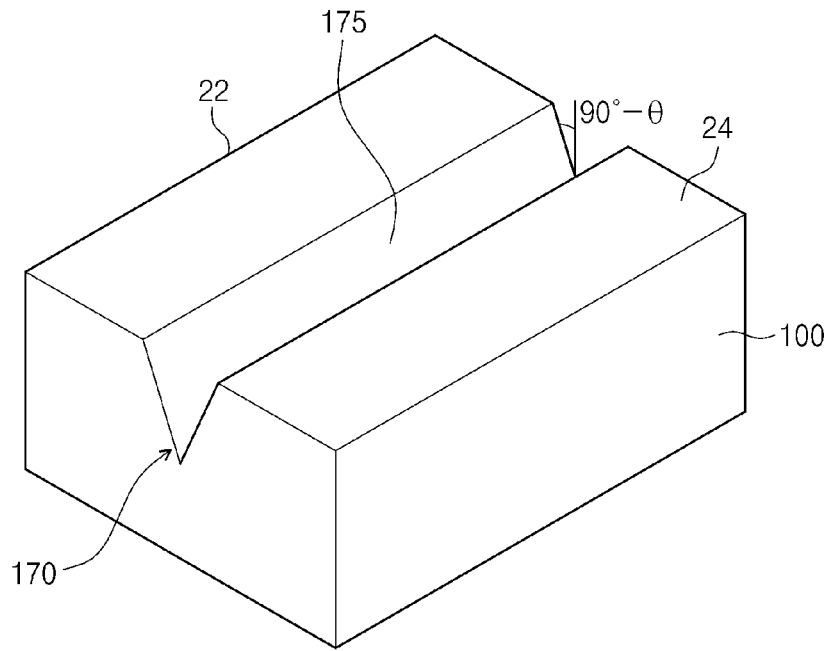

Referring to FIG. 6, the light emitting device includes the substrate 100, a light-emitting part (not shown) provided to the substrate 100, and the reflecting part 170 provided to the lower surface 24 of the substrate 100. The reflecting part 170 may have the trench 175. Unlike the case of FIGS. 2A and 2B, the trench 175 may include inclined surfaces without a bottom surface. The inclined surface may be a planar surface.

Figure 7:
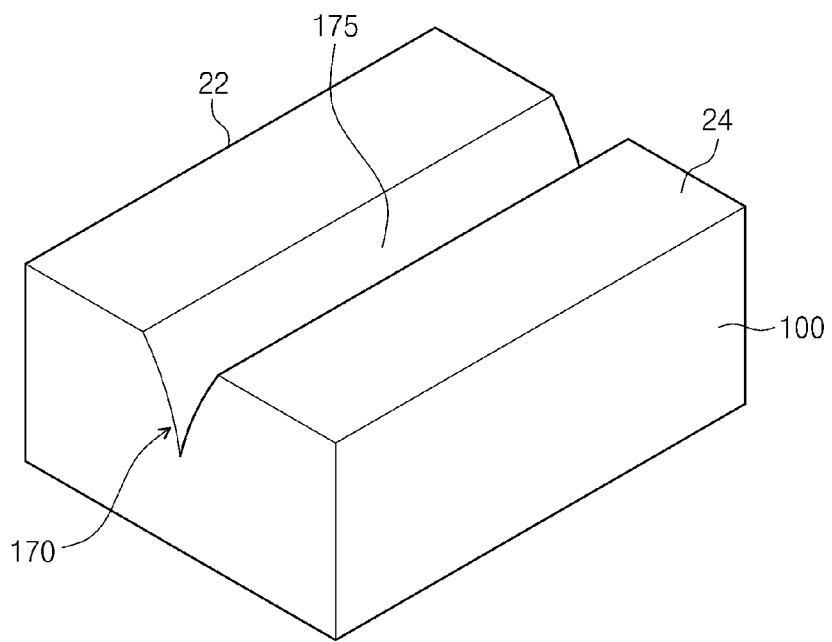

Referring to FIG. 7, the light emitting device includes the substrate 100, a light-emitting part (not shown) provided to the substrate 100, and the reflecting part 170 provided to the lower surface 24 of the substrate 100. The reflecting part 170 may have the trench 175. Unlike the case of FIGS. 2A and 2B, the trench 175 may include inclined surfaces without a bottom surface. The inclined surface may be a curved surface that may collect or spread light.

Figure 8:
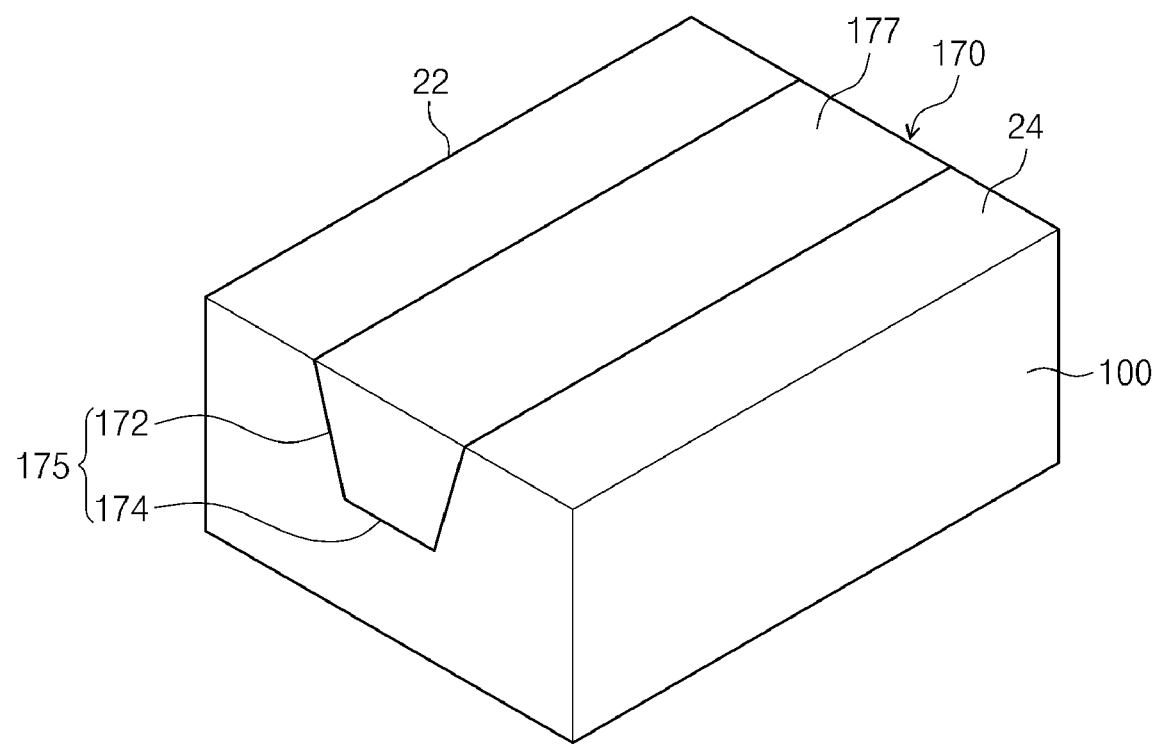

Referring to FIG. 8, the light emitting device includes the substrate 100, a light-emitting part (not shown) provided to the substrate 100, and the reflecting part 170 provided to the lower surface 24 of the substrate 100. The reflecting part 170 may have the trench 175. The trench 175 may include the bottom surface 174 and the inclined surface 172. The trench 175 may be filled with a reflecting body 177. The reflecting body 177 may be less than the substrate 100 in refractivity. The reflecting body 177 may include dielectric or metal.

Figure 9A:
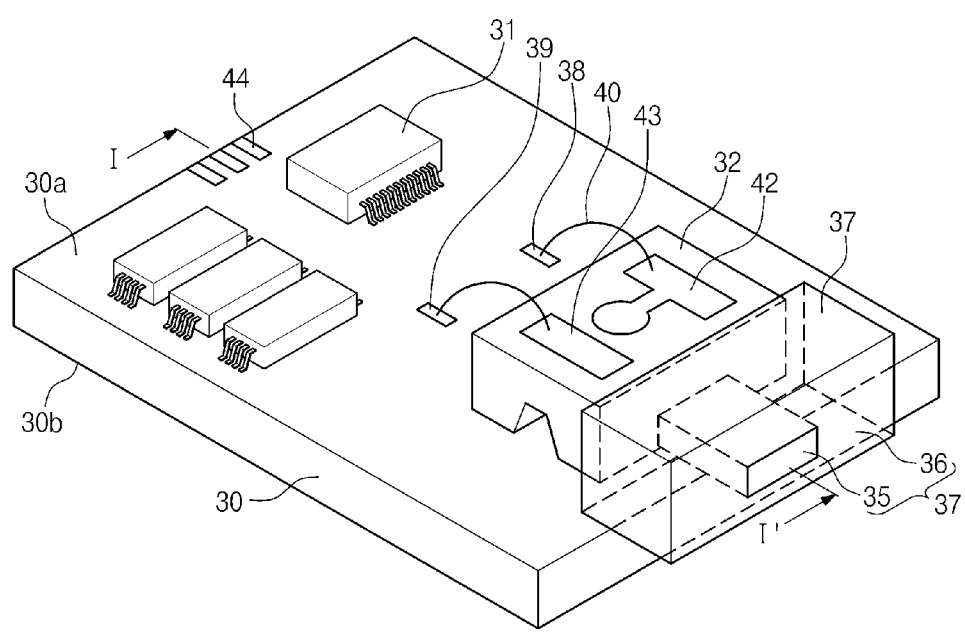
FIGS. 9A through 9C are schematic views illustrating an optical coupling module according to an embodiment of the present invention.
Figure 9B:
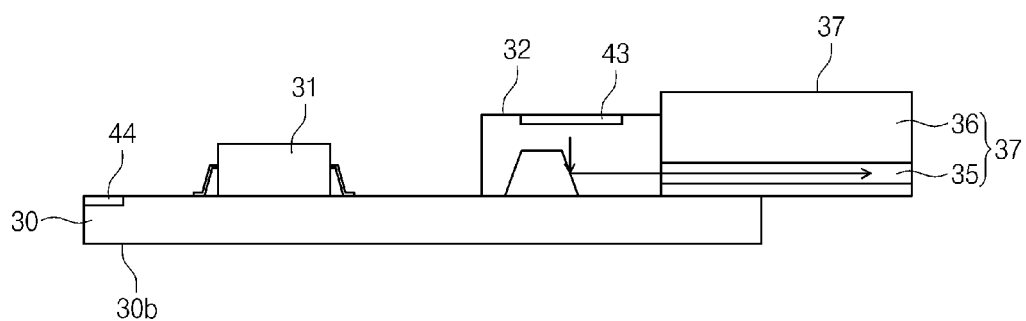
Figure 9C:
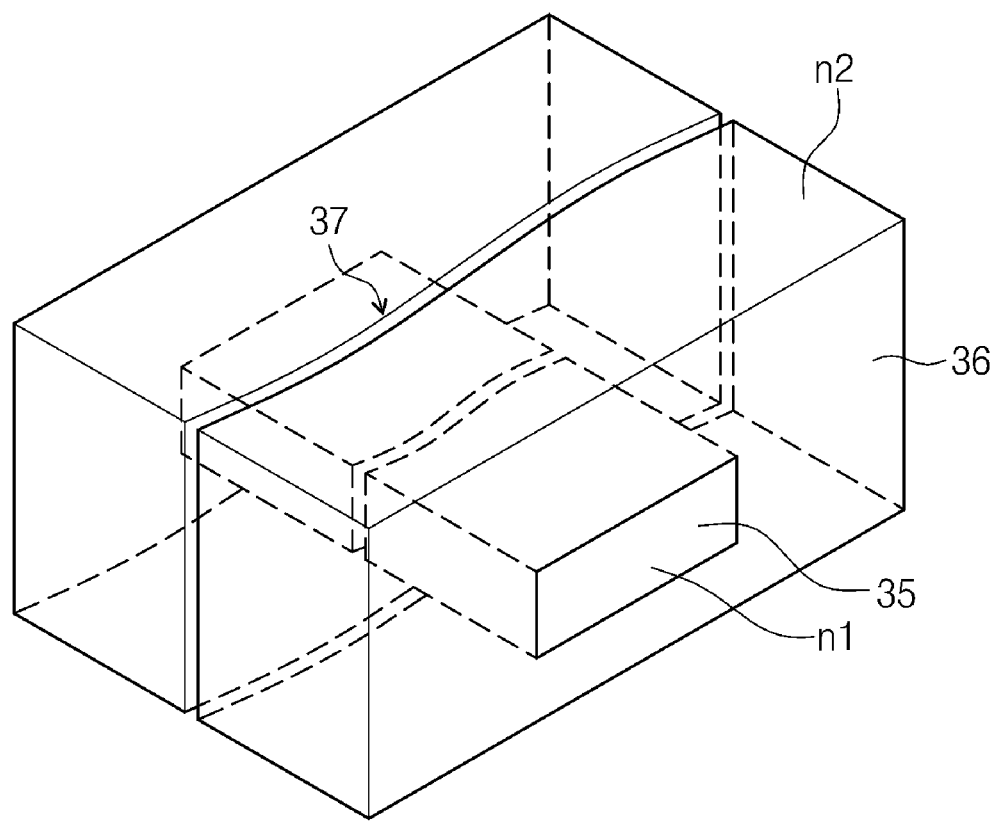

FIGS. 9A through 9C are schematic views illustrating an optical coupling module according to an embodiment of the present invention. FIG. 9B is a cross-sectional view taken along line I-I' of FIG. 9A. FIG. 9C is a schematic view illustrating the optical waveguide 37 of FIG. 9A.

Referring to FIGS. 9A and 9B, the optical coupling module includes a first mounting substrate 30, a light emitting device 32 provided to the first mounting substrate 30, and the optical waveguide 37 in direct contact with a side surface of the light emitting device 32. Referring again to FIG. 1, the light emitting device 32 includes the light-emitting part 180 provided to the substrate 100, and the reflecting part 170 provided to the lower surface of the substrate 100. The light-emitting part 180 may emit light normal to the substrate 100. The reflecting part 170 may reflect the emitted light through the side surface 22 of the substrate 100 to a side of the optical waveguide 37.

The first mounting substrate 30 may be a printed circuit board (PCB). The first mounting substrate 30 may be an interconnection substrate that may include therein a conductive interconnection (not shown) for transmitting electrical signals. The first mounting substrate 30 may include an upper surface 30a and a lower surface 30b facing the upper surface 30a. Light emitting pads 38 and 39 may be provided to the upper surface 30a, and electrically connected to the conductive interconnection. The light emitting pads 38 and 39 may include any one of copper (Cu), aluminum (Al), nickel (Ni), platinum (Pt), silver (Ag), gold (Au), and a combination thereof, which have high electrical conductivity.

The light-emitting device may include a first interconnection electrode 42 and a second interconnection electrode 43 that may be provided to an upper surface of the light emitting device. The first interconnection electrode 42 and the second interconnection electrode 43 may be electrically connected to the light emitting pads 38 and 39 through wire bonding. The first interconnection electrode 42 and the second interconnection electrode 43 may correspond to the lower electrode 112 and the upper electrode 114 illustrated in FIG. 1. Referring again to FIG. 1, the first interconnection electrode 42 and the second interconnection electrode 43 may be provided by re-interconnecting the lower electrode 112 and the upper electrode 114.

According to another embodiment of the present invention, the first interconnection electrode and/or the second interconnection electrode may be provided to a lower surface of the light emitting device 32.

A light emitting device driving part 31, driving the light emitting device 32, may be disposed on the first mounting substrate 30. The light emitting device driving part 31 may be a chip structure. The light emitting device driving part 31 may be fixed through connection pads (not shown) of the first mounting substrate 30. The light emitting device driving part 31 may be electrically connected to the light emitting pads 38 and 39 through the conductive interconnection. The first mounting substrate 30 may include external connection pads 44 that may be electrically connected to an external circuit and coupled to a coupling member provided to the external circuit.

The emitted light from the light emitting device 32 is reflected from the reflecting part 170 to the optical waveguide 37. The side surface of the light emitting device 32 may be in direct contact with the optical waveguide 37. The reflecting part of the light emitting device 32 may face the upper surface 30a of the first mounting substrate 30.

Referring to FIG. 9C, the optical waveguide 37 may include the core 35 and the cladding 36. The cladding 36 may surround the core 35. The cladding 36 and the core 35 may have tetragonal cross-sections. The optical waveguide 37 may be bendable. The optical waveguide 37 of the first mounting substrate 30 may be fixed to an adhesive or a fixing member. The cladding 36 of the optical waveguide 37 may include an optical polymer containing a halogen element or deuterium.

The core 35 of the optical waveguide 37 may include dielectric. The cross-section of the core 35 may be tetragonal, but is not limited thereto. The optical waveguide 37 may be bendable. A refractivity n1 of the core 35 may be greater than a refractivity n2 of the cladding 36.

According to another embodiment of the present invention, the core 35 of the optical waveguide 37 may be a metal wire. The core 35 may have a thickness ranging from about 5 nm to about 200 nm, and a width ranging from about 2 μm to about 100 μm.

Figure 10A:
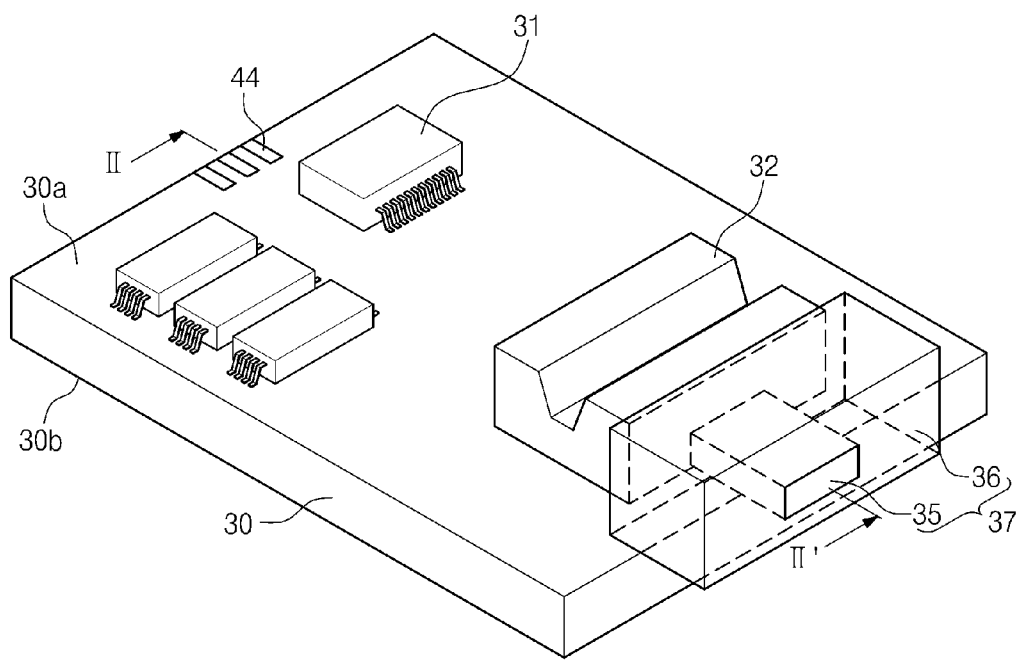
FIGS. 10A through 10B are schematic views illustrating an optical coupling module according to another embodiment of the present invention.
Figure 10B:
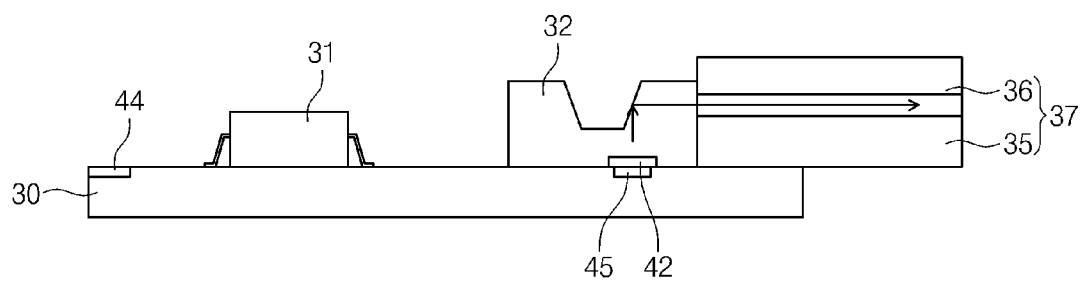

FIGS. 10A and 10B are schematic views illustrating an optical coupling module according to another embodiment of the present invention. FIG. 10B is a cross-sectional view taken along line II-II' of FIG. 10A. The same part as described with FIGS. 9A through 9C will be omitted.

Referring to FIGS. 10A and 10B, the optical coupling module includes the first mounting substrate 30, the light emitting device 32 provided to the first mounting substrate 30, and the optical waveguide 37 in direct contact with the side surface of the light emitting device 32. Referring again to FIG. 1, the light emitting device 32 includes the light-emitting part 180 provided to the substrate 100, and the reflecting part 170 provided to the lower surface of the substrate 100. The light-emitting part 180 may emit light normal to the substrate 100. The reflecting part 170 may reflect the emitted light through the side surface 22 of the substrate 100 to one side of the optical waveguide 37. The emitted light from the light emitting device 32 is reflected from the reflecting part 170 to the optical waveguide 37. The side surface of the light emitting device 32 may be in direct contact with the optical waveguide 37. The upper surface of the light emitting device 32 may face the upper surface 30a of the first mounting substrate 30. The light emitting device 32 may include the first interconnection electrode 42 and a second interconnection electrode (not shown). The first interconnection electrode 42 and the second interconnection electrode may be provided to the upper surface of the light emitting device 32. The first interconnection electrode 42 and the second interconnection electrode may be electrically connected to a light emitting pad 45.

Figure 11:
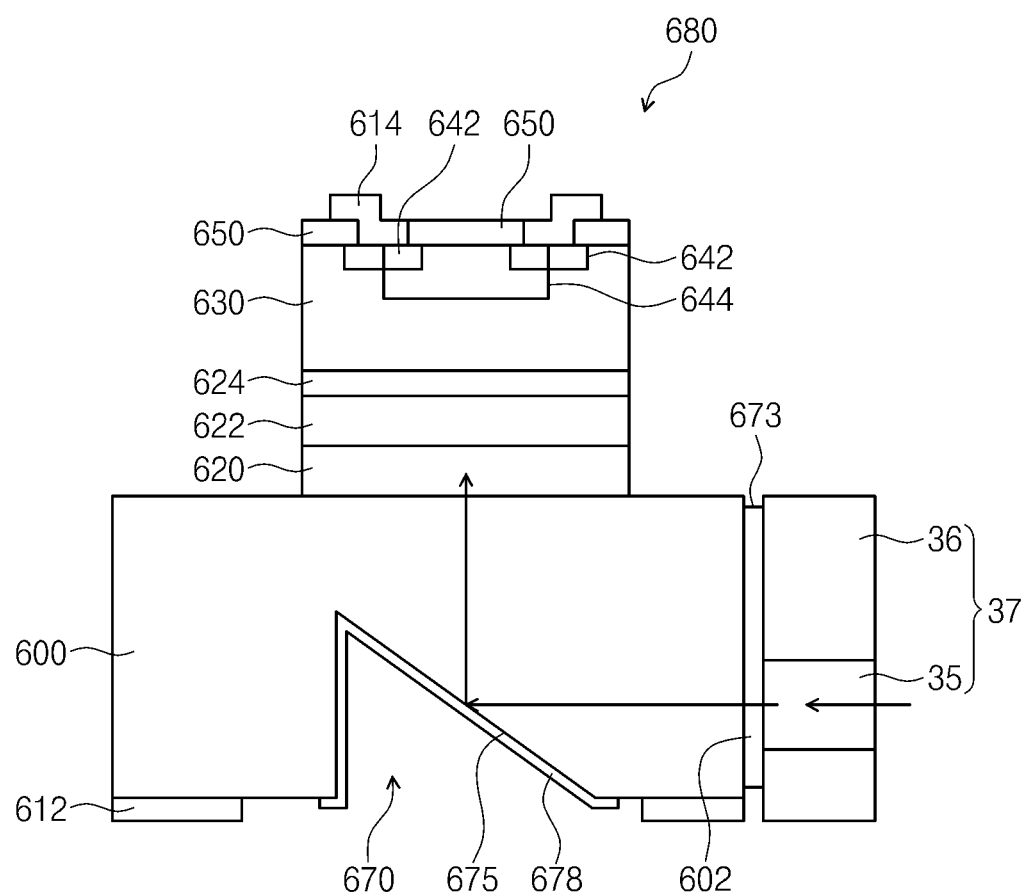
FIG. 11 is a cross-sectional view illustrating a light receiving device according to an embodiment of the present invention.

FIG. 11 is a cross-sectional view illustrating a light receiving device according to an embodiment of the present invention.

Referring to FIG. 11, the light receiving device may include a substrate 600, a light receiving part 680 provided to the substrate 600, and a reflecting part 670 provided to a lower surface of the substrate 600. The light receiving part 680 may include an absorption layer 620, a grading layer 622, a buffer layer 624, and a multiplication layer 630 that are sequentially stacked on the substrate 600. A first diffusion layer 642 may be disposed in an upper portion of the multiplication layer 630. The first diffusion layer 642 may have a ring or washer shape. A second diffusion layer 644 is disposed in the first diffusion layer 642 in the upper portion of the multiplication layer 630. Upper surfaces of the first diffusion layer 642, the second diffusion layer 644, and the multiplication layer 630 may flush with each other. A lower surface of the second diffusion layer 644 may be lower than a lower surface of the first diffusion layer 642.

The substrate 600 may be an n-type InP substrate. The absorption layer 620 may be an n-type InGaAs layer. The grading layer 622 may be an n-type InGaAsP layer. The buffer layer 624 may be an n-type InP layer. The multiplication layer 630 may be an InP layer. A dielectric passivation pattern 650 may be disposed on the multiplication layer 630, the first diffusion layer 642, and the second diffusion layer 644. An upper electrode 614 may be disposed on the dielectric passivation pattern 650. The upper electrode 614 may be in contact with the first diffusion layer 642 through the dielectric passivation pattern 650. A lower electrode 612 may be disposed in a portion of the lower surface of the substrate 600. The lower electrode 612 may be an n-type electrode, and the upper electrode 614 may be a p-type electrode.

Light, incident through a side surface 602 of the substrate 600, may be reflected in the normal direction to the substrate 600 by the reflecting part 670 provided to the lower surface of the substrate 600. An anti-reflection film 673 may be provided to the side surface 602 of the substrate 600. The optical waveguide 37 may be in contact with the side surface 602 of the substrate 600. The optical waveguide 37 may include the core 35 and the cladding 36. The side surface 602 of the substrate 600 may be in direct contact with the optical waveguide 37. Light from the optical waveguide 37 may be incident normally to the side surface 602 of the substrate 600. The incident light normally to the substrate 600 may be reflected from the reflecting part 670 provided to the lower surface of the substrate 600. The reflecting part 670 may include a trench 675 that may have an inclined surface. A reflecting film 678 may be disposed on the inclined surface of the trench 675. The light, incident through the side surface 602 of the substrate 600, is reflected without losing its intensity in the normal direction to the substrate 600 by the reflecting film 678. The reflecting film 678 may be a metal thin film or a multi-layered dielectric film. The inclined surface of the trench 675 may make about 45 degrees with the normal direction to the substrate 600.

The substrate 600 may not absorb the incident light. The incident light may be absorbed into the absorption layer 620 to form electron-hole pairs (EHPs). When a reverse bias is applied to the light receiving device, holes of the EHPs may pass through the grading layer 622 and be accelerated in the buffer layer 624. Multiplication of the holes may occur in the multiplication layer 630 and then the holes may move to the upper electrode 614.

Figure 12:
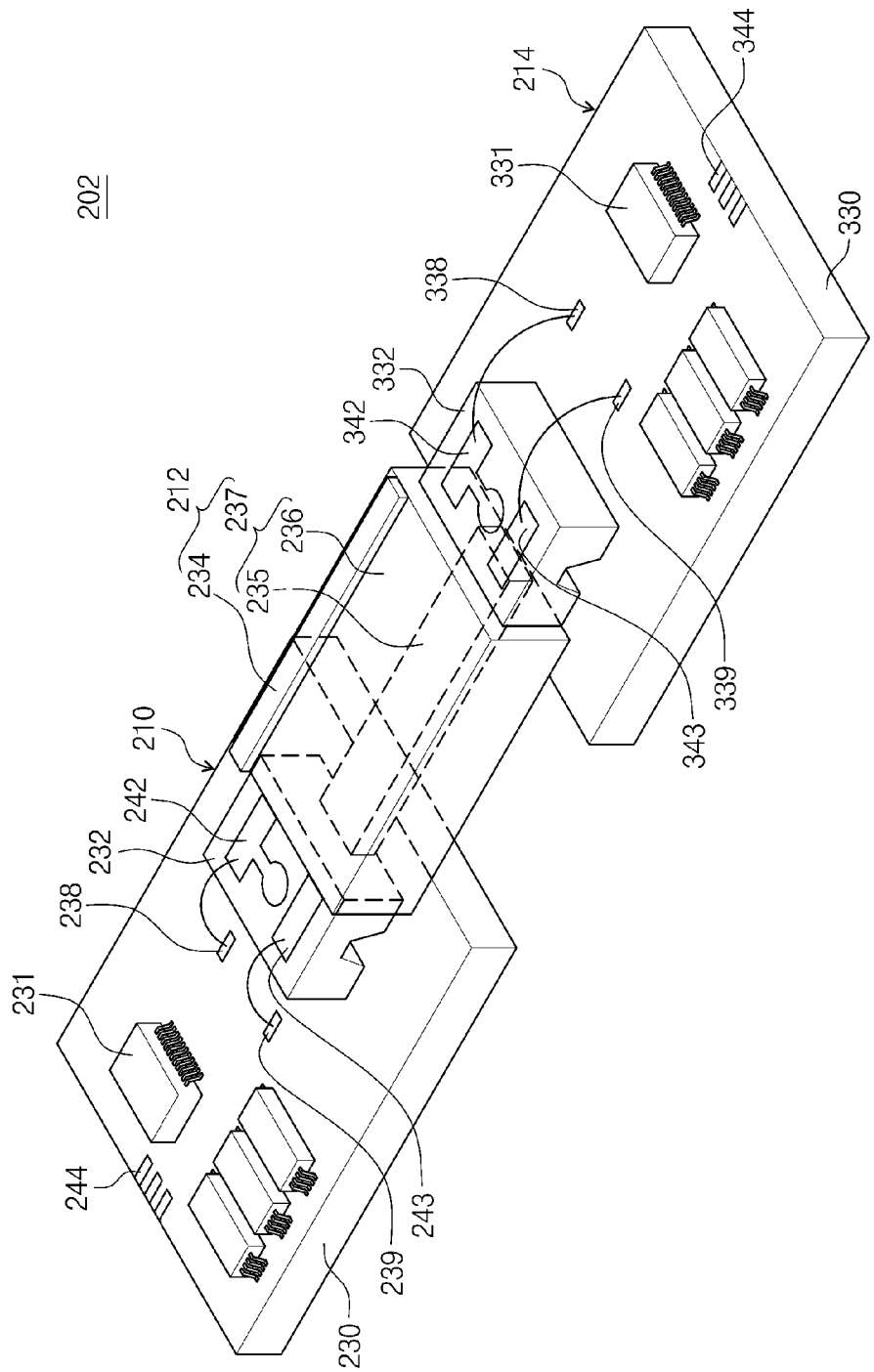
FIGS. 12 through 15 are schematic views illustrating optical coupling modules according to other embodiments of the present invention.

FIG. 12 is a schematic view illustrating an optical coupling module 202 according to another embodiment.

Referring to FIG. 12, the optical coupling module 202 may include a photoelectric transmitter unit 210, a photoelectric receiver unit 214, and a photoelectric interconnection unit 212.

The photoelectric transmitter unit 210 may include a first mounting substrate 230, a light emitting device 232 provided to the first mounting substrate 230, and a light emitting device driving part 231 driving the light emitting device 232. Referring again to FIGS. 9A through 9C, the light emitting device 232 may include a first interconnection electrode 242 and a second interconnection electrode 243 that may be provided to an upper surface of the light emitting device 232. The first interconnection electrode 242 and the second interconnection electrode 243 may be electrically connected to light emitting pads 238 and 239 through wire bonding. The first mounting substrate 230 may include external connection pads 244 that may be electrically connected to an external circuit and coupled to a coupling member provided to the external circuit.

According to another embodiment of the present invention, the first interconnection electrode 242 and/or the second interconnection electrode 243 may be provided to a lower surface of the light emitting device 232.

The photoelectric interconnection unit 212 may include an optical waveguide 237 and an electrical interconnection 234 disposed on the optical waveguide 237. The optical waveguide 237 may include a core 235 and a cladding 236 that may surround the core 235. The electrical interconnection 234 may electrically connect the photoelectric transmitter unit 210 to the photoelectric receiver unit 214. A side surface of the light emitting device 232 may be in contact with one side of the optical waveguide 237.

The photoelectric receiver unit 214 may include a light receiving device 332 in contact with another side of the optical waveguide 237, a second mounting substrate 330 provided with the light receiving device 332, and a light receiving device driving part 331 driving the light receiving device 332. The light receiving device driving part 331 may be provided to the second mounting substrate 330. The light receiving device 332 may have the similar structure to that of the light receiving device described with FIG. 11. The light receiving device 332 may be a photodiode or an avalanche photodiode (APD). The light receiving device 332 may include a light receiving part disposed on a second substrate, and a second reflecting part provided to a lower surface of the second substrate. The light receiving device 332 may provide light, incident through a side surface of the second substrate, to the light receiving part through the second reflecting part. The light receiving device 332 may include a first interconnection electrode 342 and a second interconnection electrode 343. The first interconnection electrode 342 and the second interconnection electrode 343 may be provided to an upper surface of the light receiving device 332. The first interconnection electrode 342 and the second interconnection electrode 343 may be electrically connected through wire bonding to light receiving pads 338 and 339 provided to the second mounting substrate 330. The second mounting substrate 330 may include external connection pads 344 that may be electrically connected to an external circuit and coupled to a coupling member provided to the external circuit.

According to another embodiment of the present invention, the first interconnection electrode 342 and/or the second interconnection electrode 343 may be provided to a lower surface of the light receiving device 332.

Figure 13:
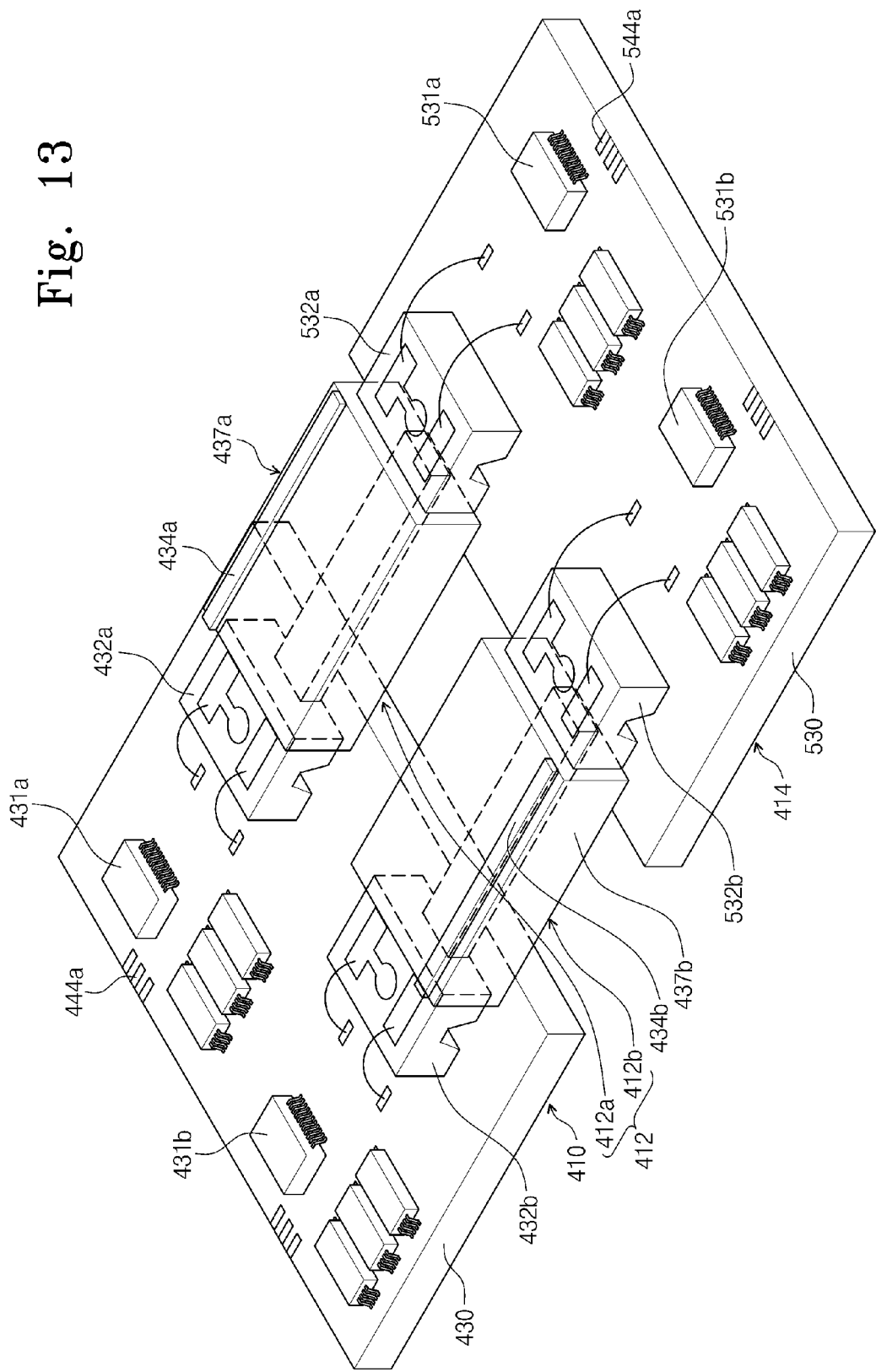

FIG. 13 is a schematic view illustrating an optical coupling module according to another embodiment of the present invention.

Referring to FIG. 13, the optical coupling module may include a first photoelectric transmitter/receiver unit 410, a second photoelectric transmitter/receiver unit 414, and a photoelectric interconnection unit 412. The first photoelectric transmitter/receiver unit 410 may include a first mounting substrate 430, a first light emitting device 432a provided to the first mounting substrate 430, a first light emitting device driving part 431a driving the first light emitting device 432a, a first light receiving device 432b provided to the first mounting substrate 430, and a first light receiving device driving part 431b driving the first light receiving device 432b. The first mounting substrate 430 may include a first external connection pad 444a.

The second photoelectric transmitter/receiver unit 414 may include a second mounting substrate 530, a second light emitting device 532b provided to the second mounting substrate 530, a second light emitting device driving part 531*b* driving the second light emitting device 532*b*, a second light receiving device 532*a* provided to the second mounting substrate 530, and a second light receiving device driving part 531*a* driving the second light receiving device 532*a*. The second mounting substrate 530 may include a second external connection pad 544*a*.

The photoelectric interconnection unit 412 may include a first photoelectric interconnection unit 412*a* and a second photoelectric interconnection unit 412*b*. The first photoelectric interconnection unit 412*a* may include a first optical waveguide 437*a* and a first electrical interconnection part 434*a*. The second photoelectric interconnection unit 412*b* may include a second optical waveguide 437*b* and a second electrical interconnection part 434*b*. The first optical waveguide 437*a* and the second optical waveguide 437*b* may include a cladding and a core. The first electrical interconnection part 434*a* may be disposed on the first optical waveguide 437*a*. The second electrical interconnection part 434*b* may be disposed on the second optical waveguide 437*b*. The first light emitting device 432*a* may be optically coupled to the second light receiving device 532*a* through the first optical waveguide 437*a*. The first light receiving device 432*b* may be optically coupled to the second light emitting device 532*b* through the second optical waveguide 437*b*. The first electrical interconnection part 434*a* and the second electrical interconnection part 434*b* may electrically connect the first mounting substrate 430 to the second mounting substrate 530. Electrical interconnections of the first electrical interconnection part 434*a* and the second electrical interconnection part 434*b* may be electrically connected through wire bonding to connection pads provided to the first mounting substrate 430.

Figure 14:
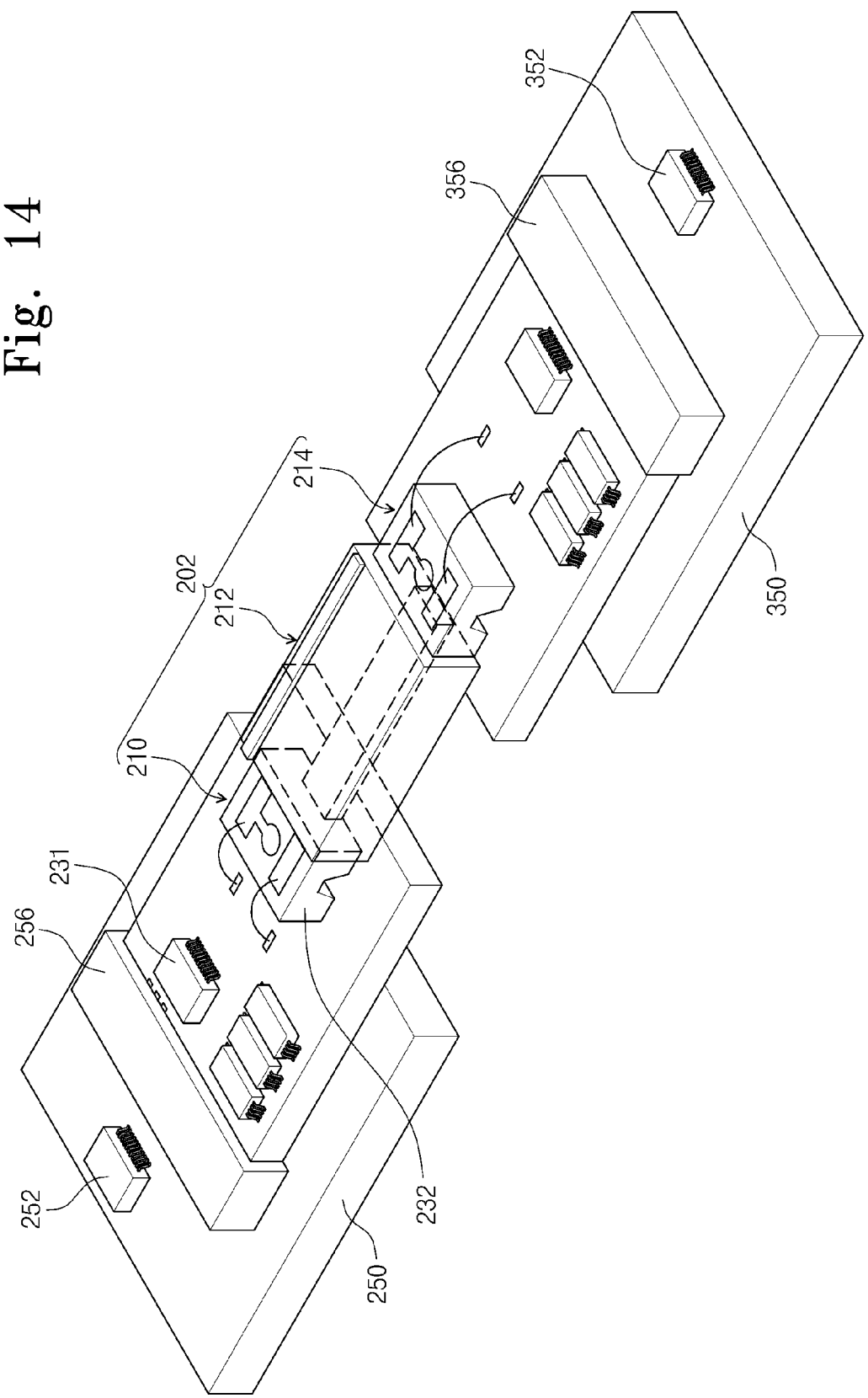

FIG. 14 is a schematic view illustrating the optical coupling module 202 according to another embodiment of the present invention.

Referring to FIGS. 12 and 14, the optical coupling module 202 may include the photoelectric transmitter unit 210, the photoelectric receiver unit 214, and the photoelectric interconnection unit 212. The photoelectric transmitter unit 210 may include the first mounting substrate 230, the light emitting device 232 provided to the first mounting substrate 230, and the light emitting device driving part 231 driving the light emitting device 232. The photoelectric interconnection unit 212 may include the optical waveguide 237 and the electrical interconnection 234 provided to the optical waveguide 237. The photoelectric receiver unit 214 may include the light receiving device 332 in contact with one side of the optical waveguide 237, the second mounting substrate 330 provided with the light receiving device 332, and the light receiving device driving part 331 driving the light receiving device 332.

The photoelectric transmitter unit 210 may be disposed on a first main board 250. The first main board 250 may include a first semiconductor chip 252 and a first electrical connector 256. The first electrical connector 256 may connect the first semiconductor chip 252 to the photoelectric transmitter unit 210 through integrated electrical signals (photoelectric signals and electrical communication signals). The photoelectric signals may be transmitted to the light emitting device driving part 231 and/or the light emitting device 232 to generate optical signals. The optical signals may be transmitted to the photoelectric receiver unit 214 through the photoelectric interconnection unit 212. The electrical communication signals may be transmitted to the photoelectric receiver unit 214 through the electrical interconnection 234 of the photoelectric interconnection unit 212.

The photoelectric receiver unit 214 may be disposed on a second main board 350. The second main board 350 may include a second semiconductor chip 352 and a second electrical connector 356. The second electrical connector 356 may connect the second semiconductor chip 352 to the photoelectric receiver unit 214 through integrated electrical signals (photoelectric signals and electrical communication signals). The photoelectric signals and electrical communication signals, transmitted to the photoelectric receiver unit 214, may be finally transmitted to the second semiconductor chip 352 of the second main board 350 through the second electrical connector 356.

Variations can be made on the optical coupling module 202 for optical communications and electrical communications between boards.

Figure 15:
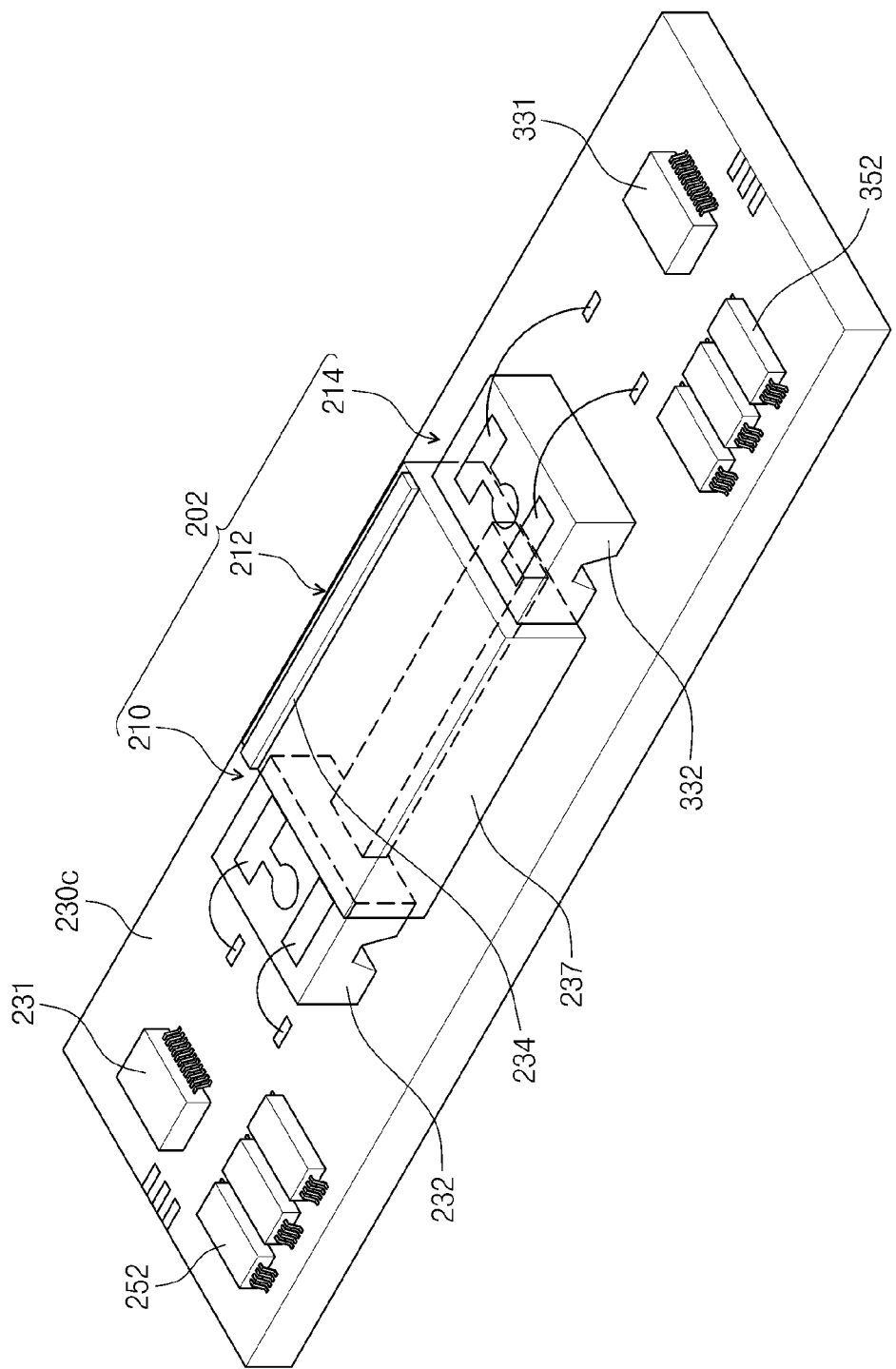

FIG. 15 is a schematic view illustrating the optical coupling module 202 according to another embodiment of the present invention.

Referring to FIGS. 12 and 15, the optical coupling module 202 may include the photoelectric transmitter unit 210, the photoelectric receiver unit 214, and the photoelectric interconnection unit 212. The photoelectric transmitter unit 210 may include a mounting substrate 230*c*, the light emitting device 232 provided to the mounting substrate 230*c*, and the light emitting device driving part 231 driving the light emitting device 232. The photoelectric interconnection unit 212 may include the optical waveguide 237 and the electrical interconnection 234 provided to the optical waveguide 237. The photoelectric receiver unit 214 may include the light receiving device 332 in contact with one side of the optical waveguide 237, and the light receiving device driving part 331 driving the light receiving device 332. The light receiving device 332 and the light receiving device driving part 331 may be provided to the mounting substrate 230*c*.

The first semiconductor chip 252 may be disposed on the mounting substrate 230*c*. The first semiconductor chip 252 may provide integrated electrical signals (photoelectric signals and electrical communication signals) to the photoelectric transmitter unit 210. The photoelectric signals may be transmitted to the light emitting device driving part 231 and/or the light emitting device 232 to generate optical signals that may be transmitted to the photoelectric receiver unit 214 through the photoelectric interconnection unit 212. The electrical communication signals may be transmitted to the photoelectric receiver unit 214 through the electrical interconnection 234 of the photoelectric interconnection unit 212.

The second semiconductor chip 352 may be disposed on the mounting substrate 230*c*. The second semiconductor chip 352 may provide integrated electrical signals (photoelectric signals and electrical communication signals) to the photoelectric receiver unit 214. Variations can be made on the optical coupling module 202 for optical communications and electrical communications within a board.

Figure 16:
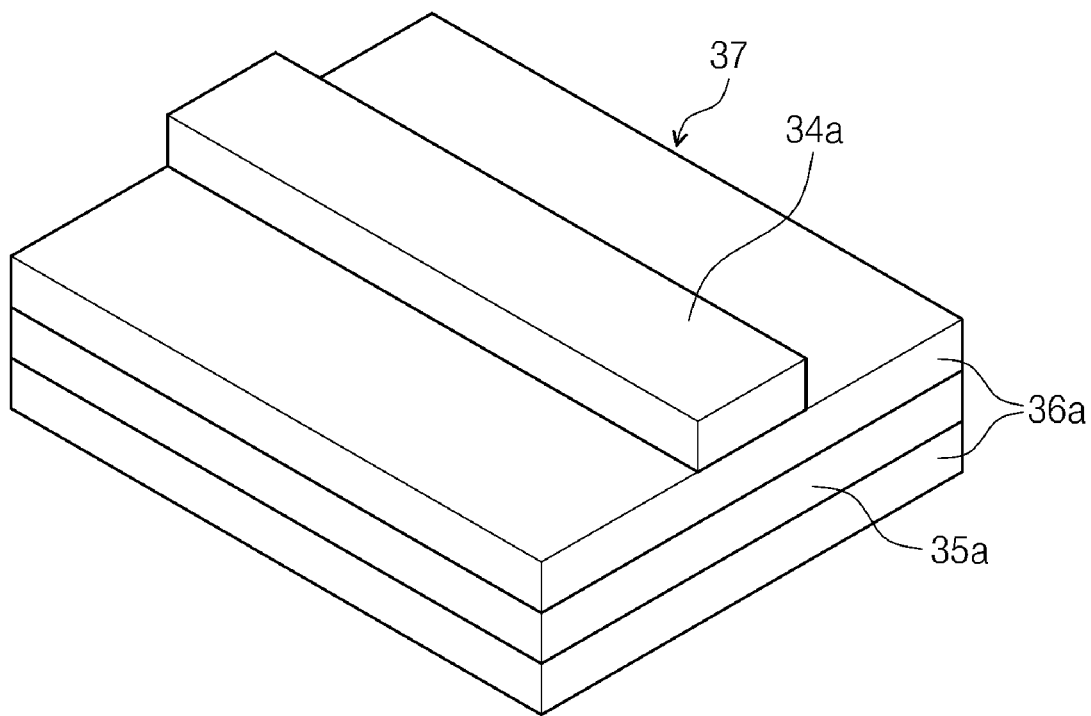
FIG. 16 is a perspective view illustrating an optical waveguide of an optical coupling module according to an embodiment of the present invention.

FIG. 16 is a perspective view illustrating the optical waveguide 37 of an optical coupling module according to an embodiment of the present invention.

Referring to FIG. 16, the optical waveguide 37 may include one of cladding layers 36*a*, a core layer 35*a*, and the other of the cladding layers 36*a* that are sequentially stacked. The core layer 35*a* may be disposed between the cladding layers 36*a*. The optical waveguide 37 may include a dielectric stack structure having a core layer and a cladding layer, and an electrical interconnection 34*a* disposed on the cladding layer 36*a*. The electrical interconnection 34*a* may apply stress to the dielectric stack structure to partially change the dielectric constant of the dielectric stack structure. Accordingly, the dielectric stack structure functions as an optical waveguide.

The light emitting device according to the embodiment of the present invention includes the reflecting part provided to the lower surface thereof, and the reflecting part improves the optical coupling efficiency between the light emitting device and the optical waveguide. The optical coupling module according to the embodiment of the present invention includes the light emitting device, the optical waveguide, and the light receiving device, and achieves high optical coupling efficiency, high integration, and low cost thereof.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A light emitting device comprising:
a substrate;
a light emitting part provided to the substrate, the substrate having an upper surface facing the light emitting part and a lower surface opposite to the upper surface;
a reflecting part including at least a portion of the lower surface of the substrate; and
a lower electrode;
wherein:
the light emitting part includes:
an active pattern disposed on the substrate;
an upper mirror provided to an upper portion of the active pattern;
an upper electrode provided on the upper mirror; and
a lower mirror provided to a lower portion of the active pattern,
the light emitting part emits light normal to the substrate,
the reflecting part reflects the emitted light to a side surface of the substrate, and
the lower electrode is disposed on the lower surface of the substrate and the lower mirror is disposed on the upper surface of the substrate.

2. The light emitting device of claim 1, wherein the reflecting part comprises a trench defined by the lower surface of the substrate.

3. The light emitting device of claim 2, wherein the trench has an inclined surface that makes about 45 degrees with a normal direction to the substrate.

4. The light emitting device of claim 2, wherein the reflecting part further comprises a reflecting film provided to a surface of the trench.

5. The light emitting device of claim 4, wherein the reflecting film comprises dielectric or metal.

6. The light emitting device of claim 2, wherein the reflecting part further comprises a reflecting body filling the trench.

7. The light emitting device of claim 6, wherein the reflecting body is less than the substrate in refractivity.

8. The light emitting device of claim 2, wherein the trench has an extension direction that is tilted from an extension direction of the side surface of the substrate.

9. The light emitting device of claim 2, wherein the trench has a curved inclined surface.

10. An optical coupling module comprising:
a first mounting substrate;
a light emitting device provided to the first mounting substrate;
an optical waveguide in direct contact with a side surface of the light emitting device,
wherein the light emitting device includes:
a light emitting part provided to a first substrate, the first substrate having an upper surface facing the light emitting part and a lower surface opposite to the upper surface, the light emitting part including an active pattern disposed on the first substrate, an upper mirror provided to an upper portion of the active pattern, an upper electrode provided on the upper mirror, and a lower mirror provided to a lower portion of the active pattern;
a reflecting part including at least a portion of the lower surface of the first substrate; and
a lower electrode,
the lower electrode is disposed on the lower surface of the first substrate and the lower mirror is disposed on the upper surface of the first substrate,
the light emitting part emits light normal to the first substrate, and
the reflecting part reflects the emitted light through a side surface of the first substrate to a first side of the optical waveguide.

11. The optical coupling module of claim 10, wherein the reflecting part of the light emitting device faces the first mounting substrate.

12. The optical coupling module of claim 10, wherein the optical waveguide comprises a dielectric waveguide having a structure including a core and a cladding.

13. The optical coupling module of claim 10, wherein the optical waveguide comprises a multimode optical fiber having a structure including a core and a cladding.

14. The optical coupling module of claim 10, wherein the optical waveguide comprises a metal line core and a dielectric cladding surrounding the metal wire core.

15. The optical coupling module of claim 14, wherein the metal line core has a thickness ranging from about 2 nm to about 200 nm, and a width ranging from about 2 μm to about 100 μm.

16. The optical coupling module of claim 10, wherein the optical waveguide comprises:
a dielectric stack structure including a core layer and a cladding layer; and
an electrical interconnection disposed on the cladding layer, and
the electrical interconnection applies stress to the dielectric stack structure.

17. The optical coupling module of claim 10, wherein the optical waveguide is bendable.

18. The optical coupling module of claim 10, wherein the first side of the optical waveguide is disposed on the first mounting substrate.

19. The optical coupling module of claim 10, further comprising:
a light receiving device in contact with a second side of the optical waveguide; and
a second mounting substrate provided with the light receiving device.

20. The optical coupling module of claim 19, wherein the second side of the optical waveguide is disposed on the second mounting substrate.

21. The optical coupling module of claim 19, wherein the light receiving device comprises:
a light receiving part disposed on a second substrate; and
a second reflecting part provided to a lower surface of the second substrate, and
the light receiving device provides light, incident through a side surface of the second substrate, to the light receiving part through the second reflecting part.

22. The optical coupling module of claim 19, wherein the first mounting substrate is formed integrally with the second mounting substrate in a single body.

23. The optical coupling module of claim 10, further comprising a light emitting device driving part disposed on the first mounting substrate and driving the light emitting device.

24. A light emitting device comprising:
a substrate;
a light emitting part on the substrate, the substrate having an upper surface facing the light emitting part and a lower surface opposite to the upper surface,
a reflecting part including at least a portion of the lower surface of the substrate;
a lower electrode; and
wherein the light emitting part includes:
a lower clad layer;
a multi-quantum well layer on the lower clad layer;
an upper clad layer on the multi-quantum well layer;
an upper mirror disposed on the upper clad layer and under the upper electrode;
an upper electrode disposed on the upper mirror; and
a lower mirror under the lower clad layer,
the light emitting part emits light normal to the substrate, and the reflecting part reflects the emitted light to a side surface of the substrate,
the lower electrode is disposed on the lower surface of the substrate and the lower mirror is disposed on the upper surface of the substrate.

* * * * *